United States Patent
Li et al.

(10) Patent No.: US 11,180,617 B2
(45) Date of Patent: Nov. 23, 2021

(54) METHOD FOR PREPARING BENZOXAZINE-CONTAINING RESIN COMPOSITION, AND PREPREG AND LAMINATE MADE THEREFROM

(71) Applicant: Shengyi Technology Co., Ltd., Guangdong (CN)

(72) Inventors: Jiang Li, Guangdong (CN); Long Xi, Guangdong (CN)

(73) Assignee: Shengyi Technology Co., Ltd., Guangdong (CN)

( * ) Notice: Subject to any disclaimer, the term of this patent is extended or adjusted under 35 U.S.C. 154(b) by 0 days.

(21) Appl. No.: 15/737,661

(22) PCT Filed: May 15, 2017

(86) PCT No.: PCT/CN2017/084314
§ 371 (c)(1),
(2) Date: Dec. 18, 2017

(87) PCT Pub. No.: WO2018/120586
PCT Pub. Date: Jul. 5, 2018

(65) Prior Publication Data
US 2020/0040146 A1    Feb. 6, 2020

(30) Foreign Application Priority Data

Dec. 30, 2016 (CN) .......................... 201611260459.0

(51) Int. Cl.
| | |
|---|---|
| *C08J 3/20* | (2006.01) |
| *C08J 5/24* | (2006.01) |
| *C08K 3/02* | (2006.01) |
| *C08K 3/04* | (2006.01) |
| *C08K 3/34* | (2006.01) |
| *C08K 3/36* | (2006.01) |
| *H05K 1/03* | (2006.01) |
| *H05K 3/02* | (2006.01) |

(52) U.S. Cl.
CPC ............... *C08J 3/203* (2013.01); *C08J 5/24* (2013.01); *C08K 3/02* (2013.01); *C08K 3/04* (2013.01); *C08K 3/34* (2013.01); *C08K 3/36* (2013.01); *H05K 1/0373* (2013.01); *C08J 2379/04* (2013.01); *C08J 2425/08* (2013.01); *C08J 2461/06* (2013.01); *C08J 2463/00* (2013.01); *C08J 2471/12* (2013.01); *C08K 2003/023* (2013.01); *C08K 2201/005* (2013.01); *H05K 3/022* (2013.01); *H05K 2201/012* (2013.01)

(58) Field of Classification Search
CPC ....................................................... C08J 3/203
See application file for complete search history.

(56) References Cited

U.S. PATENT DOCUMENTS

| | | | |
|---|---|---|---|
| 6,376,080 B1 | 4/2002 | Gallo | |
| 2002/0119317 A1* | 8/2002 | Gan | .................. H01L 23/49894 428/413 |
| 2011/0054100 A1 | 3/2011 | Gorodisher | |
| 2014/0023839 A1* | 1/2014 | Wang | ......................... C08J 5/24 428/209 |
| 2016/0362554 A1* | 12/2016 | Dyers, Jr. | .............. C08G 59/24 |

FOREIGN PATENT DOCUMENTS

| | | |
|---|---|---|
| CN | 102093666 A | 6/2011 |
| CN | 102161762 A | 8/2011 |
| CN | 102458855 A | 5/2012 |
| CN | 102575006 A | 7/2012 |
| CN | 103421273 A | 12/2013 |
| CN | 105968321 A | 9/2016 |
| JP | 2004115745 A | 4/2004 |
| JP | 2006316104 A | 11/2006 |
| KR | 20100065385 A | 6/2010 |
| TW | 200923007 | * 6/2009 |
| TW | 200923007 A | 6/2009 |
| TW | 201636332 A | 10/2016 |

OTHER PUBLICATIONS

Admatechs Product List/Silica. https://web.archive.org/web/20160410025350/https://www.admatechs.co.jp/en/product-admafine-silica.html[Apr. 15, 2020 10:07:20 AM] (Year: 2016).*

* cited by examiner

*Primary Examiner* — Megan McCulley
(74) *Attorney, Agent, or Firm* — Norton Rose Fulbright US LLP; James R. Crawford

(57) ABSTRACT

The present invention relates to a method for preparing a benzoxazine-containing resin composition and a prepreg and a laminate made therefrom. The method for preparing a benzoxazine-containing resin composition is adding an acidic filler to a benzoxazine-containing resin composition. By adding an acidic filler to the benzoxazine-containing resin composition, the present invention promotes greatly the polymerization reaction of benzoxazine and epoxy resin, reduces the curing temperature required for polymerization of benzoxazine and epoxy resin. The laminate prepared from the benzoxazine-containing resin composition, to which an acidic filler is added, has high anti-stripping stability, high glass transition temperature, low water absorption, high heat resistance, high bending strength and good processability, and can achieve low coefficient of thermal expansion.

19 Claims, No Drawings

METHOD FOR PREPARING BENZOXAZINE-CONTAINING RESIN COMPOSITION, AND PREPREG AND LAMINATE MADE THEREFROM

CROSS REFERENCE TO RELATED APPLICATIONS

This application is a § 371 of International Application No. PCT/CN2017/084314 filed May 15, 2017, and claims priority from Chinese Patent Application No. 201611260459.0 filed Dec. 30, 2016.

TECHNICAL FIELD

The present invention belongs to the technical field of copper clad laminates, in particular relates to a method for preparing a composite comprising benzoxazine and a prepreg and a laminate made therefrom.

BACKGROUND ART

Benzoxazine is a thermosetting polymer having excellent comprehensive performances, with excellent molding processability and good overall performance. Raw materials of this resin are from a wide range of sources and are low-cost, and the synthesis process of this resin is simple. Curing reaction for preparing this resin is ring-opening polymerization, which is mainly characterized by no release of small molecules, low shrinkage, low porosity and high dimensional precision. The cured product has high glass transition temperature, high elastic modulus, good heat resistance, high carbon yield, excellent flame retardancy and low water absorption.

The benzoxazine resin has an ability of self-polymerization, but the polymerization temperature thereof is above 200° C. and the product is brittle and thus is difficult to be applied in the field of composite materials for main bearing structures. Usually, components such as epoxy resin and rubber are added to improve toughness of benzoxazine, in order to achieve the purpose of improving brittleness of benzoxazine; catalyst or accelerator is added to reduce curing temperature, shorten curing time, and increase curing degree of products, in order to achieve the purpose of energy consumption and cost savings; and filler is added to reduce costs and improve coefficient of thermal expansion, in order to meet the needs of use.

CN102575006A describes a curable composition comprising a benzoxazine compound and a pentafluoroantimonic acid catalyst. The curable composition can be cured to produce a cured composition for coatings, sealants, adhesives, and many other applications.

U.S. Pat. No. 6,376,080A1 describes a method for preparing polybenzoxazine, which includes heating a molding composition including benzoxazine and a heterocyclic dicarboxylic acid to a temperature sufficient to cure the molding composition, thereby forming the polybenzoxazine. The composition is said to have a volume change close to zero after post cure.

At present, methods commonly used to reduce the curing temperature of benzoxazine include adding various catalysts such as phenols or Lewis acids, which still remain in the system with their original structures after the end of the reaction and thus bring negative impacts on the heat resistance of the system. In addition, high-boiling organic acid will remain in the resin composition, which increases the risk of delamination of PCB board when being heated in the production process. Therefore, there have been problems as to the use of benzoxazine resin.

CONTENTS OF THE INVENTION

In view of the above, the purpose of the present invention is to provide a method for preparing a benzoxazine-containing resin composition and a prepreg and a laminate made therefrom. By adding an acidic filler to the resin composition, on one hand, it is possible to promote the ring-opening crosslinking of benzoxazine, reduce the curing temperature of the benzoxazine-containing resin composition, making the filler act as a catalyst. On the other hand, the active functional groups on the surface of the acidic filler participate in the formation of the crosslinked network structure of the resin composition, and strong covalent bonds can be formed at the interface of the filler and the resin, which increase the binding force between the filler and the resin composition without remaining the filler in the system after the completion of the reaction. Thereby, the products will have increased peeling strength stability and bending strength, reduced coefficient of thermal expansion, and meanwhile the development of microcracks of the resin composition is prevented and the products can exhibit good toughness.

In order to achieve the above purpose, the inventors made repeated and thorough studies and found that the preparation of a resin composition by properly mixing an acidic filler with a benzoxazine-containing resin composition may reach the purpose.

In order to achieve the above purpose, the present invention employs the following technical solution.

A first purpose of the present invention is to provide a method for preparing a benzoxazine-containing resin composition, which is:
adding an acidic filler to a benzoxazine-containing resin composition to obtain said resin composition, wherein the pH value of the acidic filler is between 2 and 6.

In the present invention, by adding an acidic filler to a benzoxazine-containing resin composition, the ring-opening polymerization reaction of benzoxazine and epoxy resin can be catalyzed, and the coefficient of thermal expansion of the benzoxazine-containing resin composition can be reduced, and anti-stripping stability of copper clad laminates prepared from the benzoxazine-containing resin composition is improved. The addition of acidic filler greatly improves the curing efficiency of the benzoxazine-containing resin composition and reduces the use of catalyst. Laminates produced by using the resin composition have high anti-stripping stability, high glass transition temperature, high heat resistance, high bending strength and good processability, and can achieve low coefficient of thermal expansion.

In the method for preparing a benzoxazine-containing resin composition according to the present invention, the curing temperature may be 214° C. or lower, and may be, for example, 2020, 203° C., 204° C., 205° C., 206° C., 207° C., 208° C., 209° C., 210° C., 211° C., 212° C., 213° C. or 214° C., and specific point values between the above numerical values. The present invention is not exhaustive to enumerate the specific values between the above numerical values due to the length of the text and consideration of conciseness.

According to the present invention, the pH value of the acidic filler is between 2 and 6, for example, 2, 2.5, 3, 3.5, 4, 5 or 6, and specific point values between the above numerical values.

The present invention is not exhaustive to enumerate the specific values between the above numerical values due to the length of the text and consideration of conciseness.

In the present invention, the acidic filler is characterized in that the filler and deionized water are formulated into an aqueous solution at a mass ratio of 1:9, and the aqueous solution is measured to obtain the pH value of the acidic filler of 2-6.

Preferably, the pH value of the acidic filler of the present invention is between 3 and 5.

According to the present invention, the acidic filler is anyone selected from the group consisting of silica powder, quartz powder, mica powder, clay, calcium oxalate and carbon black, or a mixture of at least two of them, wherein the typical but non-limiting mixtures are silicon powder and quartz powder, clay and calcium oxalate, carbon black and mica powder.

In the present invention, the particle size of the acidic filler is between 50 nm and 50 μm, for example, 50 nm, 60 nm, 70 nm, 80 nm, 90 nm, 100 nm, 300 nm, 500 nm, 800 nm, 5 μm, 10 μm, 30 μm, 40 μm, 45 μm or 50 μm, and specific point values between the above numerical values. The present invention is not exhaustive to enumerate the specific values between the above numerical values due to the length of the text and consideration of conciseness.

The physical form of the acidic filler is not specifically limited in the present invention, and may be, for example, a sheet, a rod, a spherical shape, a hollow spherical shape, a granular shape, a fibrous shape or a plate, and the like; or it is an option that the acidic filler is treated by a silane coupling agent.

According to the present invention, the addition amount of the acidic filler is 5 to 200 parts by weight, for example, 5 parts by weight, 8 parts by weight, 10 parts by weight, 15 parts by weight, 20 parts by weight, 30 parts by weight, 40 parts by weight, 55 parts by weight, 60 parts by weight, 65 parts by weight, 70 parts by weight, 80 parts by weight, 90 parts by weight, 100 parts by weight, 120 parts by weight, 150 parts by weight, 180 parts by weight or 200 parts by weight, and specific point values between the above numerical values, based on 100 parts by weight of organic solids in the benzoxazine-containing resin composition. The present invention is not exhaustive to enumerate the specific values between the above numerical values due to the length of the text and consideration of conciseness.

According to the present invention, the amount of the benzoxazine resin is 10 to 100 parts by weight, for example, 10 parts by weight, 12 parts by weight, 15 parts by weight, 18 parts by weight, 20 parts by weight, 25 parts by weight, 30 parts by weight, 45 parts by weight, 50 parts by weight, 60 parts by weight, 70 parts by weight, 80 parts by weight, 90 parts by weight, or 100 parts by weight, and specific point values between the above numerical values, based on 100 parts by weight of organic solids in the benzoxazine-containing resin composition. The present invention is not exhaustive to enumerate the specific values between the above numerical values due to the length of the text and consideration of conciseness.

In the present invention, the benzoxazine resin is selected from diphenol-type benzoxazine and/or diamine-type benzoxazine, which may be diphenol-type benzoxazine, diamine-type benzoxazine or a mixture thereof.

The structure of the diphenol-type benzoxazine resin monomer is shown by formula (I):

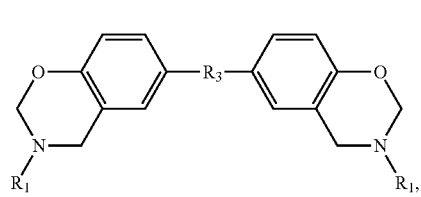

formula (I)

wherein $R_1$ is

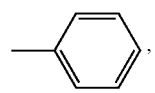

$R_2$ is any one selected from the group consisting of

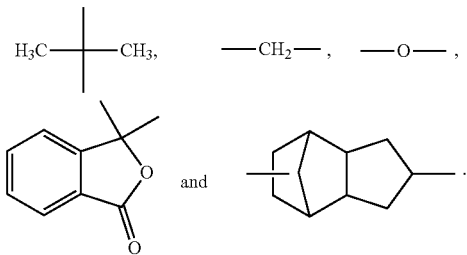

When $R_2$ is

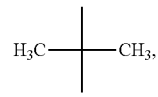

formula (I) represents diphenol A benzoxazine resin monomer; when $R_2$ is —$CH_2$— formula (I) represents diphenol F benzoxazine resin monomer; when $R_2$ is

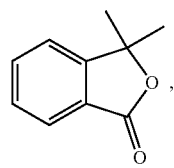

formula (I) represents phenolphthalein benzoxazine resin monomer; when $R_2$ is

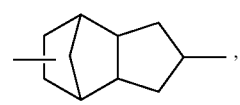

formula (I) represents dicyclopentadiene benzoxazine resin monomer.

The structure of the diamine-type benzoxazine resin monomer is shown by formula (II):

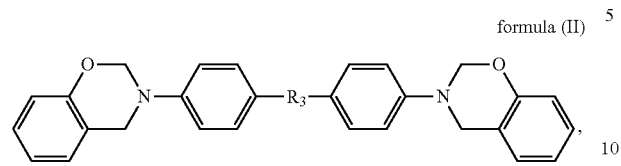

formula (II)

wherein $R_3$ is any one selected from the group consisting of

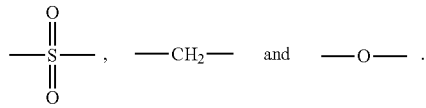

When $R_3$ is

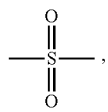

formula (II) represents DDS type benzoxazine resin monomer; when $R_3$ is —$CH_2$—, formula (II) represents MDA type benzoxazine resin monomer; when $R_3$ is —O—, formula (II) represents ODA type benzoxazine resin monomer.

According to the present invention, the benzoxazine-containing resin composition may further comprise an epoxy resin in an amount of 0 to 75 parts by weight, for example 1 parts by weight, 5 parts by weight, 8 parts by weight, 12 parts by weight, 15 parts by weight, 18 parts by weight, 20 parts by weight, 25 parts by weight, 30 parts by weight, 45 parts by weight, 50 parts by weight, 60 parts by weight, 65 parts by weight, 70 parts by weight, or 75 parts by weight, and specific point values between the above numerical values, based on 100 parts by weight of organic solids in the benzoxazine-containing resin composition. The present invention is not exhaustive to enumerate the specific values between the above numerical values due to the length of the text and consideration of conciseness.

Preferably, the epoxy resin is any one selected from the group consisting of bisphenol A epoxy resin, bisphenol F epoxy resin, o-cresol phenolic epoxy resin, bisphenol A phenolic epoxy resin, trisphenol phenolic epoxy resin, dicyclopentadiene phenolic epoxy resin, biphenyl phenolic epoxy resin, alkylbenzene phenolic epoxy resin, and naphthol phenolic epoxy resin, or a mixture of at least two of them. Wherein the typical but non-limiting mixtures are bisphenol A epoxy resin and bisphenol F epoxy resin, bisphenol A epoxy resin and bisphenol F epoxy resin, trisphenol phenolic epoxy resin and dicyclopentadiene phenolic epoxy resin, biphenyl phenolic epoxy resin and alkylphenol phenolic epoxy resin.

Preferably, the epoxy resin is selected from epoxy resins having the following structure:

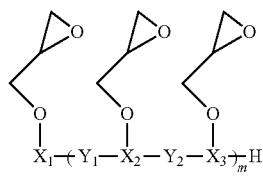

wherein, $X_1$, $X_2$ and $X_3$ are each independently selected from

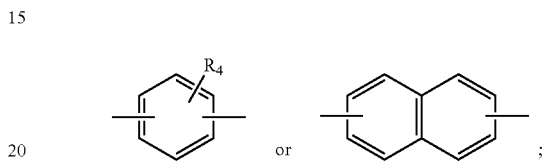

$R_4$ is any one selected from the group consisting of substituted or unsubstituted C1-C5 linear alkyl and substituted or unsubstituted C1-C5 branched alkyl, wherein the C1-C5 linear alkyl may be methyl, ethyl, propyl, n-butyl or n-pentyl, and the C1-C5 branched alkyl may be isopropyl, isobutyl or isopentyl and others;

$Y_1$ and $Y_2$ are each independently any one selected from the group consisting of —$CH_2$—,

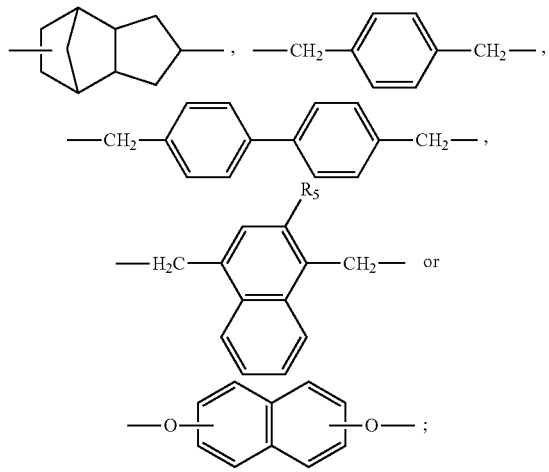

$R_5$ is any one selected from the group consisting of hydrogen atom, substituted or unsubstituted C1-C5 linear alkyl and substituted or unsubstituted C1-C5 branched alkyl, wherein the C1-C5 linear alkyl group may be methyl, ethyl, propyl, n-butyl or n-pentyl, and the C1-C5 branched alkyl may be isopropyl, isobutyl or isopentyl and others; and m is any integer of 1 to 10, for example 1, 2, 3, 4, 5, 6, 7, 9 or 10.

According to the present invention, the benzoxazine-containing resin composition may further comprise a phenolic resin in an amount of 0 to 40 parts by weight, for example 1 parts by weight, 2 parts by weight, 5 parts by weight, 8 parts by weight, 10 parts by weight, 15 parts by weight, 20 parts by weight, 25 parts by weight, 28 parts by weight, 30 parts by weight, 35 parts by weight, or 40 parts by weight, and specific point values between the above numerical values, based on 100 parts by weight of organic solids in the benzoxazine-containing resin composition. The present invention is not exhaustive to enumerate the specific values between the above numerical values due to the length of the text and consideration of conciseness.

In the present invention, the phenolic resin is any one selected from the group consisting of linear phenolic resin, bisphenol A phenolic resin, o-cresol phenolic resin, phosphorus-containing phenolic resin, and trifunctional phenolic resin, or a mixture of at least two of them, wherein the typical but non-limiting mixtures are linear phenolic resin and bisphenol A phenolic resin, bisphenol A phenolic resin and o-cresol phenolic resin, phosphorus-containing phenolic resin and trifunctional phenolic resin.

According to the present invention, the benzoxazine-containing resin composition may further comprise a cyanate ester in an amount of 0 to 50 parts by weight, for example 1 parts by weight, 2 parts by weight, 5 parts by weight, 8 parts by weight, 10 parts by weight, 15 parts by weight, 20 parts by weight, 25 parts by weight, 28 parts by weight, 30 parts by weight, 35 parts by weight, 40 parts by weight, 45 parts by weight, or 50 parts by weight, and specific point values between the above numerical values, based on 100 parts by weight of organic solids in the benzoxazine-containing resin composition. The present invention is not exhaustive to enumerate the specific values between the above numerical values due to the length of the text and consideration of conciseness.

In the present invention, the cyanate ester is any one selected from the group consisting of bisphenol A cyanate ester, phenolic cyanate ester and dicyclopentadiene phenolic resin, or a mixture of at least two of them, wherein the typical but non-limiting mixtures are bisphenol A cyanate ester and phenolic cyanate ester, phenolic cyanate ester and dicyclopentadiene phenolic resin.

According to the present invention, the benzoxazine-containing resin composition may further comprise a thermosetting polyphenylene ether in an amount of 0 to 40 parts by weight, for example 1 parts by weight, 2 parts by weight, 5 parts by weight, 8 parts by weight, 10 parts by weight, 15 parts by weight, 20 parts by weight, 25 parts by weight, 28 parts by weight, 30 parts by weight, 35 parts by weight, or 40 parts by weight, and specific point values between the above numerical values, based on 100 parts by weight of organic solids in the benzoxazine-containing resin composition. The present invention is not exhaustive to enumerate the specific values between the above numerical values due to the length of the text and consideration of conciseness.

According to the present invention, the benzoxazine-containing resin composition may further comprise an active ester, the type of which is not particularly limited in the present invention, in an amount of 0 to 40 parts by weight, for example 1 parts by weight, 2 parts by weight, 5 parts by weight, 8 parts by weight, 10 parts by weight, 15 parts by weight, 20 parts by weight, 25 parts by weight, 28 parts by weight, 30 parts by weight, 35 parts by weight, or 40 parts by weight, and specific point values between the above numerical values, based on 100 parts by weight of organic solids in the benzoxazine-containing resin composition. The present invention is not exhaustive to enumerate the specific values between the above numerical values due to the length of the text and consideration of conciseness.

According to the present invention, the benzoxazine-containing resin composition may further comprise a styrene maleic anhydride copolymer in an amount of 0 to 40 parts by weight, for example 1 parts by weight, 2 parts by weight, 5 parts by weight, 8 parts by weight, 10 parts by weight, 15 parts by weight, 20 parts by weight, 25 parts by weight, 28 parts by weight, 30 parts by weight, 35 parts by weight, or 40 parts by weight, and specific point values between the above numerical values, based on 100 parts by weight of organic solids in the benzoxazine-containing resin composition. The present invention is not exhaustive to enumerate the specific values between the above numerical values due to the length of the text and consideration of conciseness.

Preferably, the mass ratio of styrene to maleic anhydride in the styrene maleic anhydride copolymer is 9:1 to 6:4, for example 9:1, 8:2, 7:3 or 6:4, and specific point values between the above numerical values. The present invention is not exhaustive to enumerate the specific values between the above numerical values due to the length of the text and consideration of conciseness.

In the present invention, the term "organic solid(s)" means benzoxazine resin and optional epoxy resin, phenolic resin, cyanate ester, thermosetting polyphenylene ether, and styrene maleic anhydride copolymer, which may participate in cross-linking polymerization together.

According to the present invention, the benzoxazine-containing resin composition may further comprise a flame retardant.

The flame retardant is not particularly limited in the present invention as long as it has flame-retarding effect on the benzoxazine-containing resin composition.

Preferably, the flame retardant is any one selected from the group consisting of decabromodiphenyl ether, octabromoether, hexabromocyclododecane, tetrabromobisphenol A, decabromodiphenyl ethane, triphenyl phosphate, tricresyl phosphate, trioctyl phosphate, diphenyl octyl phosphate, diphenyl isodecyl phosphate, tri(xylene) phosphate, diphenyl tert-butylphenyl phosphate, diphenyl isopropylphenyl phosphate, resorcinol bis[di(2,6-dimethylphenyl) phosphate], diphenyl isooctyl phosphate, aluminum methylethylphosphinate, aluminum diethylphosphinate, aluminum hydroxymethylphenylphosphinate, 3-hydroxyphenylphosphinyl-propanoic acid, hydroxyphenylphosphoryl propanoic acid, hydroxypropionyloxy phenylphosphonoyl, 2-carboxyethyl(phenyl)phosphinic acid, 9,10-dihydro-9-oxa-10-phosphaphenanthrene-10-oxide, and poly[nitrilo(diphenoxyphosphoranylidyne)], or a mixture of at least two of them, wherein the typical but non-limiting mixtures are decabromodiphenyl ether and octabromoether, hexabromocyclododecane and tetrabromobisphenol A, triphenyl phosphate and tricresyl phosphate, diphenyl isooctyl phosphate and aluminum methylethylphosphinate.

According to the present invention, the benzoxazine-containing resin composition may further comprise a curing accelerator.

The curing accelerator in the present invention is not particularly limited as long as it can catalyze the reaction of epoxy functional group and benzo ring and reduce the reaction temperature of the curing system, and is preferably any one selected from the group consisting of an imidazole compound, a derivative of an imidazole compound, a piperidine compound, Lewis acid and triphenylphosphine, or a mixture of at least two of them, and further preferably any one selected from the group consisting of 2-methylimidazole, 2-ethyl-4-methylimidazole, 2-phenylimidazole and triphenylphosphine, or a mixture of at least two of them.

Examples of the imidazole compound include any one of 2-methylimidazole, 2-ethyl-4-methylimidazole, 2-phenylimidazole or 2-undecylimidazole, or a mixture of at least two of them.

Examples of the piperidine compound include any one of 2,3-diaminopiperidine, 2,5-diaminopiperidine, 2,6-diaminopiperidine, 2-amino-3-methylpiperidine, 2-amino-4-methylpiperidine, 2-amino-3-nitropiperidine, 2-amino-5-nitropiperidine or 2-amino-4,4-dimethylpiperidine, or a mixture of at least two of them.

Preferably, the addition amount of the curing accelerator is 0 to 1 part by weight, for example, 0.05 parts by weight, 0.1 parts by weight, 0.15 parts by weight, 0.2 parts by weight, 0.25 parts by weight, 0.3 parts by weight, 0.35 parts by weight, 0.4 parts by weight, 0.45 parts by weight, 0.5 parts by weight, 0.55 parts by weight, 0.6 parts by weight, 0.65 parts by weight, 0.7 parts by weight, 0.75 parts by weight, 0.8 parts by weight, 0.85 parts by weight, 0.9 parts by weight, 0.95 parts by weight or 1 part by weight, based on 100 parts by weight of the total addition amounts of acidic filler, benzoxazine and epoxy resin, and specific point values between the above numerical values which are not enumerated due to the length of the text and consideration of conciseness, preferably 0.05 to 0.8 parts by weight, and more preferably 0.05 to 0.6 parts by weight.

According to the present invention, the benzoxazine-containing resin composition may further comprise a non-acidic filler, for example optionally selected from any one selected from the group consisting of calcium carbonate, calcium sulfate, alumina, barium sulfate, ceramic powder, talcum powder and hydrotalcite, or a mixture of at least two of them, wherein the typical but non-limiting mixtures are calcium carbonate and calcium sulfate, alumina and barium sulfate, ceramic powder and talcum powder.

A second purpose of the present invention to provide a benzoxazine-containing resin composition which comprises a benzoxazine resin and an acidic filler, wherein the acidic filler is added in an amount of 5 to 200 parts by weight based on 100 parts by weight of organic solids in the benzoxazine-containing resin composition, and the acidic filler has a pH value between 2 and 6.

It will be appreciated by those skilled in the art that the benzoxazine-containing resin composition may optionally comprise, in addition to the benzoxazine resin and the acidic filler, the following components described for the first purpose of the present invention: epoxy resin, phenolic resin, cyanate ester, thermosetting polyphenylene ether, active ester, styrene maleic anhydride copolymer, flame retardant, curing accelerator and non-acidic filler, etc., and each component contained in the resin composition and the amounts thereof can exemplarily refer to the ranges described for the first purpose of the present invention.

The present invention utilizes a benzoxazine-containing resin composition comprising acidic filler, wherein the acidic filler can not only catalyze the ring-opening polymerization of benzoxazine and epoxy resin but also reduce the coefficient of thermal expansion of the benzoxazine resin composition, and improve anti-stripping stability of copper-clad laminates, and meanwhile greatly improve the curing efficiency of the benzoxazine-containing resin composition and reduce the use of catalyst. A laminate produced by using the resin composition has excellent anti-stripping stability, high glass transition temperature, high heat resistance, high bending strength and good processability, and can achieve low coefficient of thermal expansion.

The term "comprise(s)/comprising", "contain(s)/containing" used in the present invention means that in addition to the components described, other components which give the resin composition different characteristics can also be included. In addition, the term "comprise(s)/comprising", "contain(s)/containing" used in the present invention may also be replaced by a closed description as "is/being" or "consist(s) of/consisting of".

For example, the benzoxazine-containing resin composition may further comprise various additives. Specific examples thereof include antioxidant, heat stabilizer, antistatic agent, ultraviolet absorber, pigment, colorant, or lubricant, etc. These additives may be used alone or in combination of two or more of them.

For the preparation steps of the benzoxazine-containing resin composition which are not further defined in the present invention, those skilled in the art can refer to the existing preparation methods of resin compositions and composite materials and select them according to actual situations, and the present invention does not limit them specifically.

The present invention also provides a prepreg comprising a resin composition prepared according to the first purpose of the present invention or a resin composition according to the second purpose of the present invention, and a reinforcing material. The reinforcing material used is not particularly limited, and may be organic fiber, inorganic fiber woven fabric or a nonwoven fabric. The organic fiber may be selected from aramid nonwovens, and the inorganic fiber woven fabric can be E-glass cloth, D-glass cloth, S-glass cloth, T-glass cloth, NE-glass cloth or quartz cloth. The thickness of the reinforcing material is not particularly limited, and the woven fabric or nonwoven fabric preferably has a thickness in the range of 0.01 to 0.2 mm in view of good dimensional stability of laminates, and is preferably subjected to fiber splitting treatment and a surface treatment with silane coupling agent. In order to provide good water resistance and heat resistance, the silane coupling agent is preferably any one of epoxy silane coupling agent, aminosilane coupling agent or vinyl silane coupling agent, or a mixture of at least two of them. The above-mentioned composite material is impregnated with the reinforcing material and then is baked at 100 to 250° C. for 1 to 15 minutes, and thereby a prepreg is obtained.

The copper clad laminate for printed circuit board of the present invention comprises a laminate formed by bonding two or more prepregs by heating and pressing, and copper foils bonded on one or both sides of the laminate. The copper clad laminate is required to meet the following requirements: 1. heating rate for lamination: usually the heating rate should be controlled at 1.0-3.0° C./min when the temperature of material is 80-160° C.; 2. pressure setting for lamination: full pressure, which is about 300 psi, is applied when the temperature of the outer material layer is 80-100° C.; 3. when curing, the material temperature is controlled in the range of 180-210° C. and is kept for 60-180 min. The metal foil covered on the laminate can be, in addition to copper foil, nickel foil, aluminum foil and SUS foil, etc., and its material is not limited.

Compared with the prior art, the present invention has at least the following advantageous effects:

(1) By adding an acidic filler to the benzoxazine-containing resin composition, the present invention promotes the polymerization reaction of benzoxazine and epoxy resin, reduces the curing temperature required for polymerization of benzoxazine and epoxy resin, thus makes the reaction of benzoxazine and epoxy more complete, improves the curing efficiency of the benzoxazine-containing resin composition, and reduces the use of catalyst.

(2) The laminate in the present invention prepared by the benzoxazine-containing resin composition, to which an acidic filler is added, has high anti-stripping stability, high glass transition temperature, high heat resistance, high bending strength and good processability, and can achieve low coefficient of thermal expansion.

EMBODIMENTS

The technical solutions of the present invention are further described by the following examples.

The following descriptions are specific examples of the embodiments of the present invention, and it should be noted that those skilled in the art can make a number of improvements and modifications without departing from the principles of the examples of the present invention, and these improvements and modifications are also considered to fall within the protection scope of the present invention.

The examples of the present invention will be described in further details with reference to the following examples. The embodiments of the present invention are not limited to the following specific examples. It is possible to appropriately change the examples without changing the scope of the claims.

In the following, the "parts" represents "parts by weight" and "%" represents "% by weight", unless otherwise specified.

The materials and their trademark informations of the examples and comparative examples are as follows.

(A) Acidic Fillers
A-1: acidic filler, spherical silicon powder, pH: 4, purchased from Jiangsu Lianrui, model: DQ1030;
A-2: acidic filler, quartz powder, pH: 3, purchased from Wuzhou Yingfeng Mining Company, model: 3000 mesh air flow quartz powder;
A-3: acidic filler, mica powder, pH: 5, purchased from Anhui GeRui, model: GD-2;
A-4: acidic filler, carbon black, pH: 3, purchased from Tianjin Xinglongtai Chemical Products Technology Co., Ltd.

(B) Benzoxazine
B-1: diphenol-type benzoxazine, bisphenol A benzoxazine, purchased from HUNSTMAN, model: LZ8290;
B-2: diamine-type benzoxazine, 4,4'-diaminodiphenyl ether benzoxazine, purchased from Sichuan EM Technology Co., Ltd., model: D125;

(C) Epoxy Resin
C-1: DCPD epoxy resin, purchased from Japan DIC, model: HP-7200;
C-2: biphenyl type epoxy resin: purchased from NIPPON KAYAKU, model: NC-3000H;
D: linear phenolic, purchased from KOLON in Korea, model: KGH-3300;
E: cyanate ester, purchased from LONZA, model: BA-3000S;
F: thermosetting polyphenylene ether, purchased from SABIC, model: SA-90;
G: active ester, purchased from SHINA in Korea, model: SHC-4314;
H: styrene maleic anhydride copolymer, purchased from the Sartomer, model: EF-40;
I: flame retardant, purchased from Otsuka Chemical Co., Ltd., model: SPB-100;
J: accelerator, purchased from SHIKOKU, model: 2-MI.

(K) Non-Acidic Filler
K-1: non-acidic filler, spherical silicon powder, pH: 8, purchased from admatechs in Japan, model: SC2500-SEJ;
K-2: non-acidic filler, alumina, pH: 9, purchased from Bengbu Xinyuan Materials Technology Co., Ltd., model: SJA-0051;
K-3: non-acidic filler, calcium carbonate, pH: 9, purchased from Guangdong Zhongqi, model: 1500 mesh light calcium carbonate;
K-4: non-acidic filler, talcum powder, pH: 8, purchased from Specialty Minerals Inc. in America, model: AG-609.

The resin compositions of examples and comparative examples were used to prepare laminates for printed circuit according to the following method, and the properties of the prepared laminates were tested.

The method for preparing a laminate for printed circuit includes:
Preparing a laminate by bonding at least one sheet of the prepreg by heating and pressing;
Bonding metal foils at one side or both sides of the laminate obtained in step ①;
Laminating the resultant of step ② in a laminator.

In step ②, eight prepregs and two sheets of metal foils in an amount of 1 ounce (having a thickness of 35 μm) were superimposed together.

In step ③, the operating conditions for laminating are: heating rate is controlled to be 1.5-2.5° C./min when the material temperature is 80-140° C.; full pressure, which is about 350 psi, is applied when the temperature of the outer material layer is 80-100° C.; when curing, the material temperature is 195° C. and is kept for more than 60 min.

Formulations and test results of properties of resin compositions provided in examples and comparative examples are shown in the following tables.

TABLE 1

| | Ex. 1 | Ex. 2 | Ex. 3 | Ex. 4 | Ex. 5 | Ex. 6 | Comp. Ex. 1 | Comp. Ex. 2 | Comp. Ex. 3 | Comp. Ex. 4 |
|---|---|---|---|---|---|---|---|---|---|---|
| A-1 | 50 | 100 | — | — | — | 50 | — | — | — | — |
| A-2 | — | — | 50 | — | — | — | — | — | — | — |
| A-3 | — | — | — | 50 | — | — | — | — | — | — |
| A-4 | — | — | — | — | 50 | — | — | — | — | — |
| K-1 | — | — | — | — | — | — | 50 | — | — | — |
| K-2 | — | — | — | — | — | — | — | 50 | — | — |
| K-3 | — | — | — | — | — | — | — | — | 50 | — |
| K-4 | — | — | — | — | — | — | — | — | — | 50 |
| B-1 | — | — | — | — | — | 100 | — | — | — | — |
| B-2 | 100 | 100 | 100 | 100 | 100 | — | 100 | 100 | 100 | 100 |
| J | Appropriate amount | Appropriate amount | Appropriate amount | Appropriate amount | Appropriate amount | Appropriate amount | Appropriate amount | Appropriate amount | Appropriate amount | Appropriate amount |
| DSC initial reaction temperature ° C. | 198 | 190 | 196 | 201 | 194 | 199 | 215 | 217 | 213 | 219 |

TABLE 1-continued

|  | Ex. 1 | Ex. 2 | Ex. 3 | Ex. 4 | Ex. 5 | Ex. 6 | Comp. Ex. 1 | Comp. Ex. 2 | Comp. Ex. 3 | Comp. Ex. 4 |
|---|---|---|---|---|---|---|---|---|---|---|
| DSC peak temperature ° C. | 233 | 236 | 237 | 238 | 235 | 234 | 260 | 251 | 254 | 258 |
| Glass transition temperature (DSC)° C. | 215 | 219 | 216 | 215 | 210 | 209 | 206 | 205 | 209 | 202 |
| Bending strength, MPa | 492 | 486 | 502 | 486 | 475 | 476 | 473 | 456 | 446 | 462 |
| CTE (50-260) | 1.7 | 1.6 | 1.7 | 1.7 | 1.8 | 1.8 | 1.9 | 1.8 | 2 | 1.9 |
| Peeling strength | 1.15-1.21 | 1.16-1.22 | 1.13-1.19 | 1.14-1.20 | 1.17-1.21 | 1.14-1.19 | 1.02-1.18 | 1.04-1.17 | 1.09-1.20 | 1.01-1.12 |

TABLE 2

|  | Ex. 7 | Ex. 8 | Ex. 9 | Ex. 10 | Ex. 11 | Ex. 12 |
|---|---|---|---|---|---|---|
| A-1 | 30 | 30 | 30 | 30 | 30 | 30 |
| B-2 | 50 | 50 | 50 | 50 | 50 | 50 |
| C-1 | 50 | — | 30 | 30 | 30 | — |
| C-2 | — | 50 | — | — | — | — |
| D | — | — | 20 | — | — | — |
| E | — | — | — | 20 | — | — |
| F | — | — | — | — | 20 | — |
| G | — | — | — | — | — | 50 |
| H | — | — | — | — | — | — |
| I | 10 | 10 | 10 | 10 | 10 | 10 |
| J | Appropriate amount | Appropriate amount | Appropriate amount | Appropriate amount | Appropriate amount | Appropriate amount |
| K-1 | — | — | — | — | — | — |
| DSC initial reaction temperature ° C. | 152 | 163 | 166 | 162 | 155 | 152 |
| DSC peak temperature ° C. | 234 | 232 | 238 | 236 | 237 | 233 |
| Glass transition temperature (DSC)° C. | 196 | 194 | 199 | 213 | 209 | 190 |
| Bending strength, MPa | 482 | 479 | 489 | 493 | 488 | 465 |
| CTE (50-260) | 1.8 | 1.9 | 2 | 1.8 | 1.8 | 2 |
| Peeling strength | 1.14-1.20 | 1.16-1.21 | 1.18-1.22 | 1.16-1.22 | 1.17-1.19 | 1.16-1.23 |

|  | Ex. 13 | Ex. 14 | Comp. Ex. 5 | Comp. Ex. 6 | Comp. Ex. 7 | Comp. Ex. 8 |
|---|---|---|---|---|---|---|
| A-1 | 30 | 15 | — | — | — | — |
| B-2 | 50 | 50 | 50 | 50 | 50 | 50 |
| C-1 | 30 | 50 | 50 | 30 | — | 30 |
| C-2 | — | — | — | — | — | — |
| D | — | — | — | — | — | — |
| E | — | — | — | 20 | — | — |
| F | — | — | — | — | — | — |
| G | 10 | — | — | — | 50 | 10 |
| H | 10 | — | — | — | — | 10 |
| I | 10 | 10 | 10 | 10 | 10 | 10 |
| J | Appropriate amount | Appropriate amount | Appropriate amount | Appropriate amount | Appropriate amount | Appropriate amount |
| K-1 | — | 15 | 30 | 30 | 30 | 30 |
| DSC initial reaction temperature ° C. | 160 | 178 | 209 | 206 | 207 | 203 |

TABLE 2-continued

| | | | | | | |
|---|---|---|---|---|---|---|
| DSC peak temperature °C. | 237 | 243 | 254 | 256 | 260 | 257 |
| Glass transition temperature (DSC)° C. | 196 | 195 | 191 | 182 | 182 | 189 |
| Bending strength, MPa | 475 | 462 | 465 | 476 | 462 | 446 |
| CTE (50-260) | 2 | 1.9 | 2 | 2.1 | 2.4 | 2.2 |
| Peeling strength | 1.14-1.18 | 1.08-1.17 | 1.02-1.13 | 1.03-1.12 | 1.02-1.14 | 1.01-1.10 |

Tested items of properties and specific methods thereof are as follows:

(a) Initial Reaction Temperature

The initial reaction temperature was tested according to differential scanning calorimetry (DSC) under nitrogen atmosphere with a heating rate of 10° C./min.

(b) Glass Transition Temperature

The glass transition temperature was tested according to differential scanning calorimetry (DSC) method as specified in IPC-TM-650 2.4.25.

(c) Bending Strength

The bending strength was tested according to IPC-TM-650 2.4.4 B method.

(d) CTE

The coefficient of thermal expansion was tested according to IPC-TM-650 2.4.41 method.

(e) Peeling Strength (PS)

The peeling strength of the metal overlayer was tested under the conditions of "after thermal stress" in the IPC-TM-650 2.4.8 method.

From the performance data of each of the examples and comparative examples in Table 1, it can be seen that:

for the test results of examples 1-6 and comparative examples 1-4, examples 1-6 with the addition of acidic filler can remarkably reduce the reaction temperature of the resin composition compared with comparative examples 1-4 with the addition of ordinary non-acidic filler, and the initial reaction temperature in examples 1-6 is only 194-201° C. while it is at least 213° C. in comparative examples 1-4;

in addition, laminates obtained in examples 1-6 have higher peeling strength stability, and the difference in peeling strength was only 0.06 to 0.08, while it can be 0.11 or more in comparative examples 1-4 showing a deteriorated peeling strength stability;

furthermore, laminates obtained in examples 1-6 have higher glass transition temperature, and also lower coefficient of thermal expansion and high bending strength;

moreover, from the comparison of example 1 and example 2, it can be seen that the addition of more acidic fillers further can improve glass transition temperature, reduce curing temperature and coefficient of thermal expansion of the resin composition.

From the performance data of each of the examples and comparative examples in Table 2, it can be seen that: for examples 7-14 and comparative examples 5-8, the addition of phenolic resin, cyanate ester, thermosetting polyphenylene ether, active ester and styrene maleic anhydride copolymer in the benzoxazine systems containing acidic filler can also reduce curing reaction temperature, improve peeling strength stability, improve glass transition tempera-ture of the resin composition, and reduce coefficient of thermal expansion of the resin composition.

As described above, the laminate prepared by the resin composition into which an acidic filler is added of the present invention has more stable peeling strength, higher glass transition temperature, high bending strength, lower coefficient of thermal expansion, and is suitable for use in the fields which requires a thermosetting resin with high modulus, high strength, low thermal expansion and others.

The applicant states that: the present application illustrates the detailed method of the present invention by the above examples, but the present invention is not limited to the detailed method, that is, it does not mean that the present invention must be conducted relying on the above detailed method. Those skilled in the art should understand that any modifications to the present invention, any equivalent replacements of each raw material of the present invention and the additions of auxiliary ingredients, the selections of specific embodiments and the like all fall into the protection scope and the disclosure scope of the present invention.

The invention claimed is:

1. A method for preparing a benzoxazine-containing resin composition, wherein the method comprises the steps of:
    adding an acidic filler to a benzoxazine-containing resin composition, wherein the pH value of the acidic filler is between 2 and 6,
    wherein the benzoxazine is diamine benzoxazine;
    wherein the diamine benzoxazine resin monomer has a structure of formula (II)

formula (II)

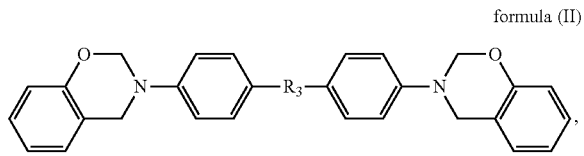

wherein $R_3$ is any one selected from the group consisting of

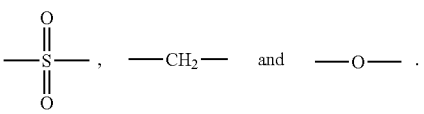

wherein the addition amount of the acidic filler is 5 to 200 parts by weight, based on 100 parts by weight of organic solids in the benzoxazine-containing resin composition.

2. The method of claim 1, wherein the acidic filler is any one selected from the group consisting of silica powder, quartz powder, mica powder, clay, calcium oxalate and carbon black, or a mixture of at least two of them.

3. The method of claim 1, wherein the particle size of the acidic filler is between 50 nm and 50 μm.

4. The method of claim 1, wherein the amount of the benzoxazine resin is 10 to 100 parts by weight, based on 100 parts by weight of organic solids in the benzoxazine-containing resin composition.

5. The method of claim 1, wherein the benzoxazine-containing resin composition comprises an epoxy resin;
wherein the epoxy resin is in an amount greater than 0 to 75 parts by weight or less, based on 100 parts by weight of organic solids;
the epoxy resin is any one selected from the group consisting of bisphenol A epoxy resin, bisphenol F epoxy resin, o-cresol phenolic epoxy resin, bisphenol A phenolic epoxy resin, trisphenol phenolic epoxy resin, dicyclopentadiene phenolic epoxy resin, biphenyl phenolic epoxy resin, alkylbenzene phenolic epoxy resin, and naphthol phenolic epoxy resin, or a mixture of at least two of them.

6. The method of claim 5, wherein the benzoxazine-containing resin composition comprises a curing accelerator;
the curing accelerator is in an amount greater than 0, to 1 part by weight or less, based on 100 parts by weight of the total addition amounts of acidic filler, benzoxazine and epoxy resin;
the curing accelerator is any one selected from the group consisting of an imidazole compound, a derivative of an imidazole compound, a piperidine compound, Lewis acid and triphenylphosphine, or a mixture of at least two of them.

7. The method of claim 5, wherein the benzoxazine-containing resin composition comprises a non-acidic filler;
the non-acidic filler is any one selected from the group consisting of calcium carbonate, calcium sulfate, alumina, barium sulfate, ceramic powder, talcum powder and hydrotalcite, or a mixture of at least two of them; and
the non-acidic filler is in an amount greater than 0 to 100 parts by weight or less, based on 100 parts by weight of the total addition amounts of acidic filler, benzoxazine and epoxy resin.

8. The method of claim 5, wherein the epoxy resin is selected from epoxy resins having the following structure:

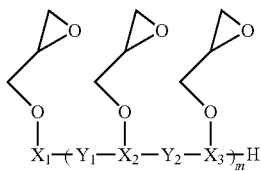

wherein $X_1$, $X_2$ and $X_3$ are each independently selected from

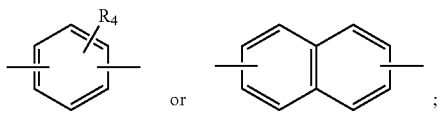

$R_4$ is any one selected from the group consisting of substituted or unsubstituted C1-C5 linear alkyl and substituted or unsubstituted C1-05 branched alkyl;

$Y_1$ and $Y_2$ are each independently any one selected from the group consisting of —$CH_2$—,

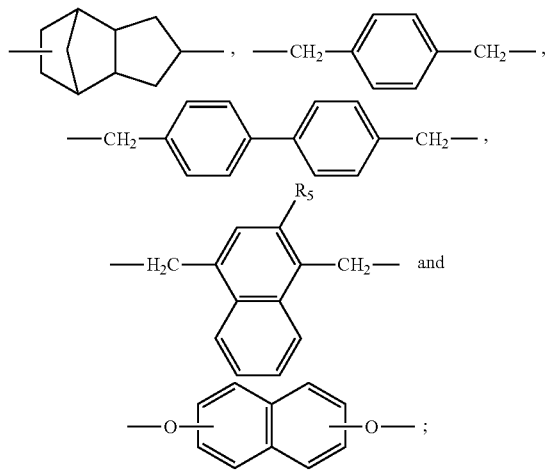

$R_5$ is any one selected from the group consisting of hydrogen atom, substituted or unsubstituted C1-C5 linear alkyl and substituted or unsubstituted C1-05 branched alkyl; and m is any integer of 1 to 10.

9. The method of claim 1, characterized in that the benzoxazine-containing resin composition comprises a phenolic resin;
the amount of the phenolic resin is 0 to 40 parts by weight, based on 100 parts by weight of organic solids;
the phenolic resin is any one selected from the group consisting of linear phenolic resin, bisphenol A phenolic resin, o-cresol phenolic resin, phosphorus-containing phenolic resin, and trifunctional phenolic resin, or a mixture of at least two of them.

10. The method of claim 1, characterized in that the benzoxazine-containing resin composition comprises a cyanate ester;
the amount of the cyanate ester is 0 to 50 parts by weight, based on 100 parts by weight of organic solids;
the cyanate ester is any one selected from the group consisting of bisphenol A cyanate ester, phenolic cyanate ester and dicyclopentadiene phenolic resin, or a mixture of at least two of them.

11. The method of claim 1, characterized in that the benzoxazine-containing resin composition comprises a thermosetting polyphenylene ether;
the amount of the thermosetting polyphenylene ether is 0 to 40 parts by weight, based on 100 parts by weight of organic solids.

12. The method of claim 1, characterized in that the benzoxazine-containing resin composition comprises an active ester;
the amount of the active ester is 0 to 40 parts by weight, based on 100 parts by weight of organic solids.

13. The method of claim 1, characterized in that the benzoxazine-containing resin composition comprises a styrene maleic anhydride copolymer;
the amount of the styrene maleic anhydride copolymer is 0 to 40 parts by weight, based on 100 parts by weight of organic solids;

the mass ratio of styrene to maleic anhydride in the styrene maleic anhydride copolymer is 9:1 to 6:4.

14. The method of claim 1, wherein the benzoxazine-containing resin composition comprises a flame retardant; the flame retardant is any one selected from the group consisting of decabromodiphenyl ether, octabromoether, hexabromocyclododecane, tetrabromobisphenol A, decabromodiphenyl ethane, triphenyl phosphate, tricresyl phosphate, trioctyl phosphate, diphenyl octyl phosphate, diphenyl isodecyl phosphate, tri(xylene) phosphate, diphenyl tert-butylphenyl phosphate, diphenyl isopropylphenyl phosphate, resorcinol bis[di(2,6-dimethylphenyl) phosphate], diphenyl isooctyl phosphate, aluminum methylethylphosphinate, aluminum diethylphosphinate, aluminum hydroxymethylphenylphosphinate, 3-hydroxyphenylphosphinyl-propanoic acid, hydroxyphenylphosphoryl propanoic acid, hydroxypropionyloxy phenylphosphonoyl, 2-carboxyethyl(phenyl)phosphinic acid, 9,10-dihydro-9-oxa-10-phosphaphenanthrene-10-oxide, and poly[nitrilo(diphenoxyphosphoranylidyne)], or a mixture of at least two of them.

15. A benzoxazine-containing resin composition, characterized in that it comprises a benzoxazine resin and an acidic filler, wherein the acidic filler is added in an amount of 5 to 200 parts by weight based on 100 parts by weight of organic solids in the benzoxazine-containing resin composition, wherein the benzoxazine is diamine benzoxazine; wherein the diamine benzoxazine resin monomer has a structure of formula (II)

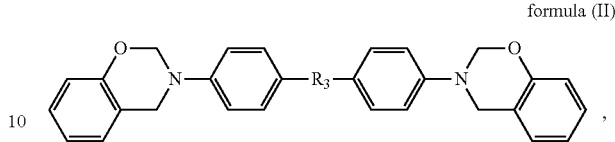

formula (II)

wherein $R_3$ is any one selected from the group consisting of

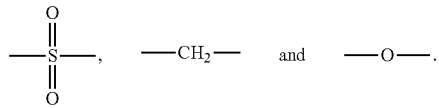

16. The benzoxazine-containing resin composition of claim 15, characterized in that the acidic filler has a pH value between 2 and 6.

17. A prepreg comprising a resin composition of claim 15.

18. A laminate comprising at least one sheet of the prepreg of claim 17.

19. A printed circuit board comprising at least one sheet of the prepreg of claim 17.

* * * * *